(12) United States Patent
Takizawa et al.

(10) Patent No.: US 8,920,047 B2
(45) Date of Patent: Dec. 30, 2014

(54) OPTICAL MODULE

(75) Inventors: Toru Takizawa, Musashimurayama (JP); Kaoru Yoda, Kitasaku-gun (JP)

(73) Assignee: Citizen Holdings Co., Ltd., Tokyo (JP)

( * ) Notice: Subject to any disclaimer, the term of this patent is extended or adjusted under 35 U.S.C. 154(b) by 148 days.

(21) Appl. No.: 13/554,524

(22) Filed: Jul. 20, 2012

(65) Prior Publication Data

US 2013/0022323 A1 Jan. 24, 2013

(30) Foreign Application Priority Data

Jul. 21, 2011 (JP) ................................. 2011-160268

(51) Int. Cl.
*G02B 6/36* (2006.01)
*G02B 6/42* (2006.01)
*H01S 5/022* (2006.01)
*G02B 6/26* (2006.01)
*G02B 6/12* (2006.01)
*G02F 1/35* (2006.01)

(52) U.S. Cl.
CPC .............. *G02B 6/4233* (2013.01); *H01S 5/022* (2013.01); *G02B 6/4225* (2013.01); *G02B 6/3652* (2013.01); *G02B 6/4224* (2013.01); *G02B 6/4232* (2013.01); *G02B 6/4243* (2013.01); *G02B 6/262* (2013.01); *G02B 2006/12147* (2013.01); *G02F 2001/3505* (2013.01)
USPC ............................................. 385/92; 385/88

(58) Field of Classification Search
CPC .. G02B 6/4225; G02B 6/4226; G02B 6/4234; G02B 6/4256; G02B 6/4257; G02B 6/426
See application file for complete search history.

(56) References Cited

U.S. PATENT DOCUMENTS

| | | | | |
|---|---|---|---|---|
| 5,179,609 A | * | 1/1993 | Blonder et al. | 385/89 |
| 5,574,811 A | | 11/1996 | Bricheno et al. | |
| 6,181,854 B1 | * | 1/2001 | Kojima et al. | 385/49 |
| 6,309,113 B1 | * | 10/2001 | Naito | 385/88 |
| 6,435,733 B1 | * | 8/2002 | Parat et al. | 385/88 |
| 7,255,491 B2 | * | 8/2007 | Takagi | 385/88 |

(Continued)

FOREIGN PATENT DOCUMENTS

| | | |
|---|---|---|
| CN | 101317113 A | 12/2008 |
| CN | 102684064 A | 9/2012 |

(Continued)

OTHER PUBLICATIONS

Extended European Search Report issued in corresponding European Patent Application No. 12175536.7, dated Oct. 22, 2012.

(Continued)

*Primary Examiner* — Rhonda Peace
(74) *Attorney, Agent, or Firm* — Sughrue Mion, PLLC

(57) ABSTRACT

On a mounting substrate 101, an LD element 102 and a wavelength converter element 103 are mounted as optical elements. An end of an optical fiber 105 is fixed, at a given length, in a fiber anchoring groove 301 of a sub-substrate 104. The sub-substrate 104 is mounted to the mounting substrate 101 with the surface supporting the optical fiber 105 opposing thereto, and the wavelength converter element 103 and the optical fiber 105 being coupled. By mounting of the sub-substrate 104 to the mounting substrate 101, the coupling position of the output end of the wavelength converter element 103 and the input end of the optical fiber 105 is provided an internal position that is a given distance from the end of mounting substrate 101.

7 Claims, 14 Drawing Sheets

(56) References Cited

U.S. PATENT DOCUMENTS

| | | | |
|---|---|---|---|
| 8,515,219 B2 * | 8/2013 | Abe et al. | 385/14 |
| 2008/0245843 A1 | 10/2008 | Suga et al. | |
| 2009/0080831 A1 | 3/2009 | Nakamura | |
| 2011/0122481 A1 | 5/2011 | Ide et al. | |
| 2011/0280512 A1 * | 11/2011 | Abe et al. | 385/14 |
| 2012/0234458 A1 * | 9/2012 | Yoda | 156/64 |
| 2013/0022323 A1 * | 1/2013 | Takizawa et al. | 385/92 |
| 2013/0336614 A1 * | 12/2013 | Yoda et al. | 385/14 |

FOREIGN PATENT DOCUMENTS

| | | | |
|---|---|---|---|
| EP | 2500757 A1 | 9/2012 | |
| JP | 06-005839 A | 1/1994 | |
| JP | 08-201664 A | 8/1996 | |
| JP | 09-054228 A | 2/1997 | |
| JP | 11-095062 A | 4/1999 | |

OTHER PUBLICATIONS

Communication dated Mar. 4, 2014, issued by the State Intellectual Property Office of the People's Republic of China in corresponding Application No. 201210249515.6.

Office Action issued in corresponding Chinese Patent Application No. 201210249515.6 dated Oct. 8, 2014.

* cited by examiner

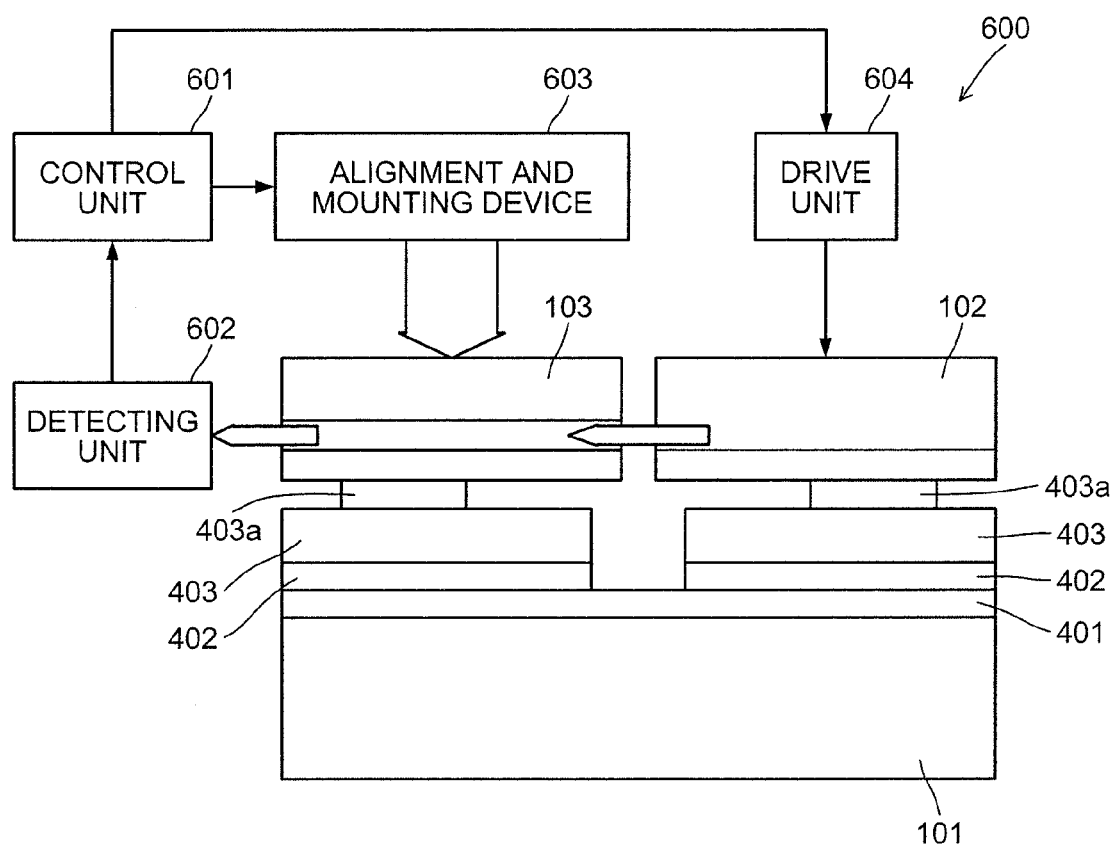

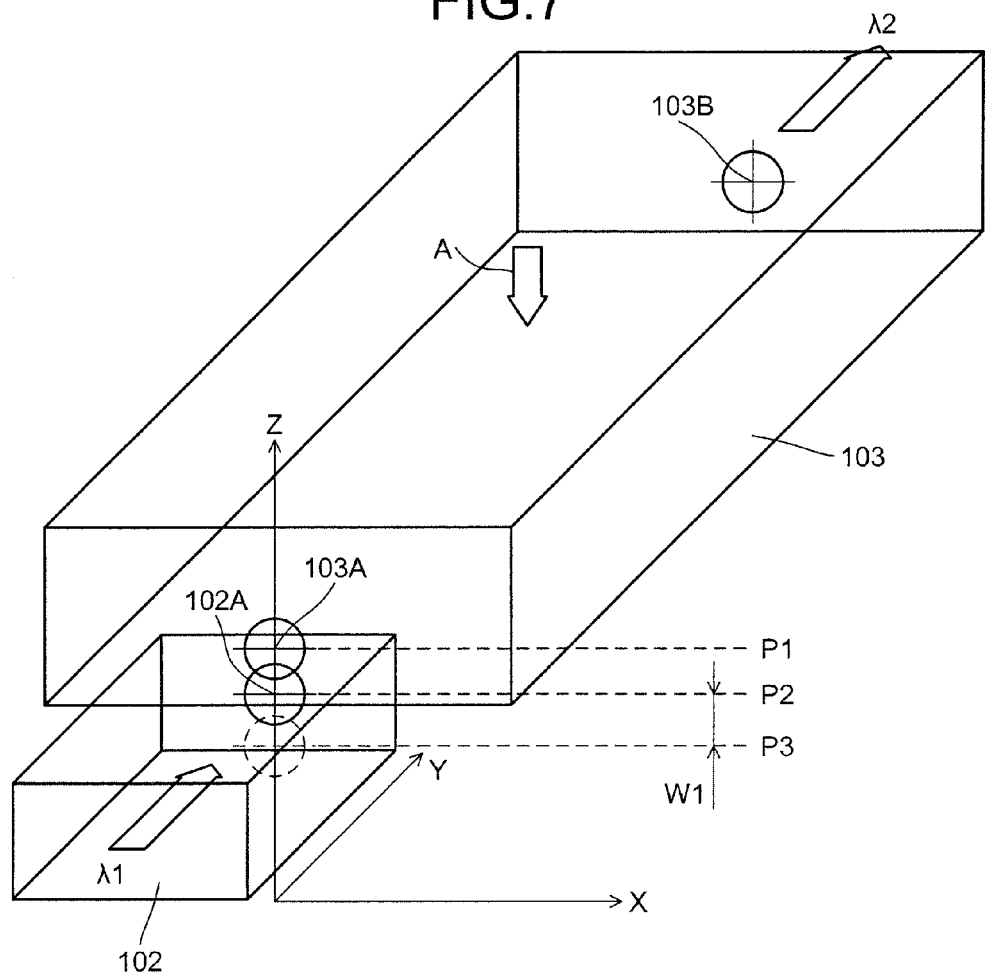

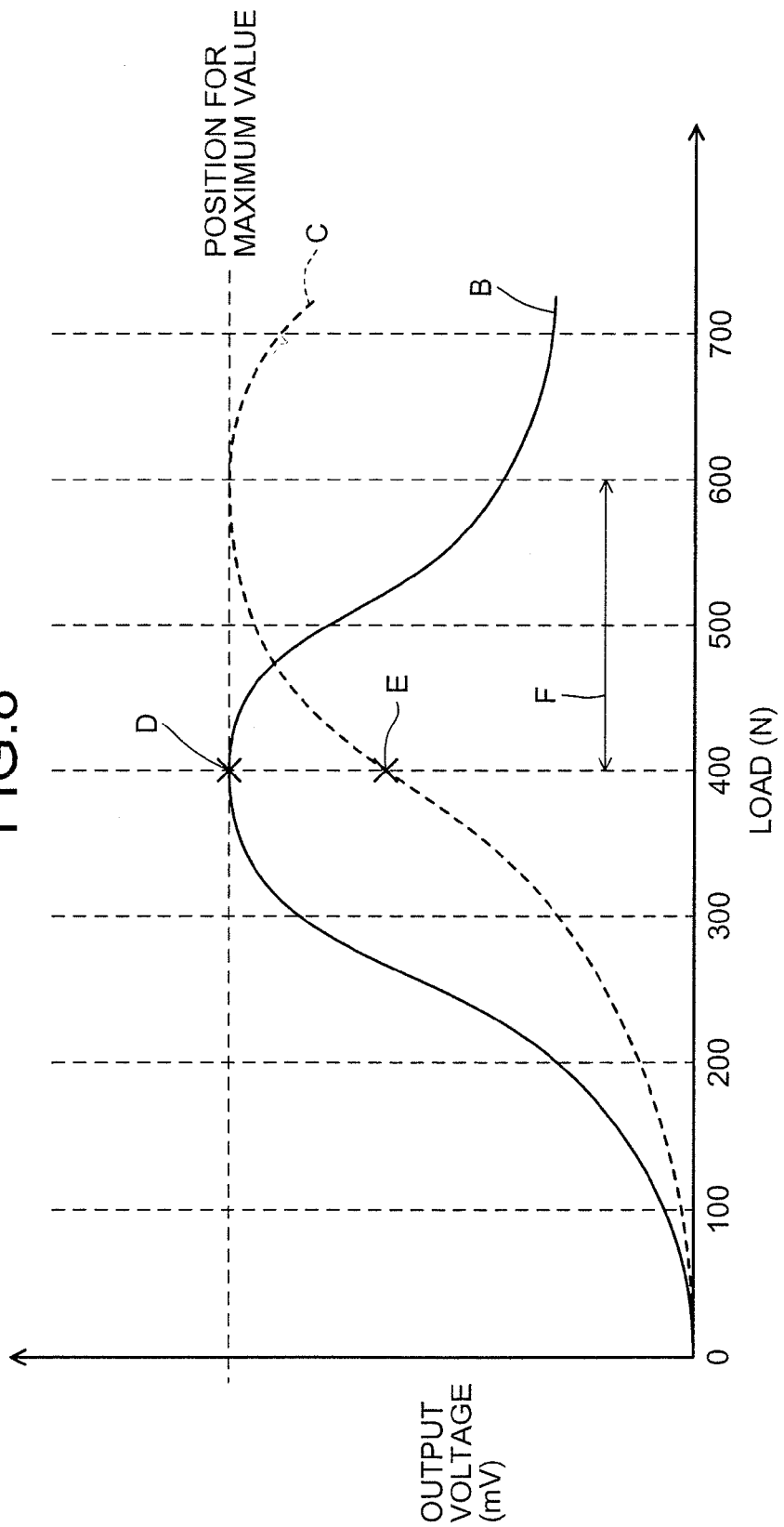

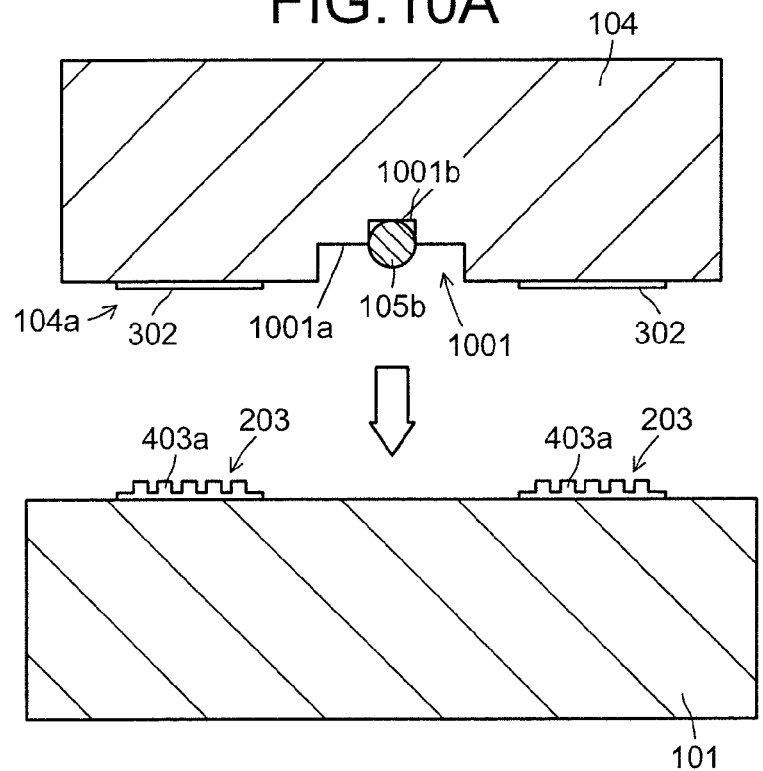
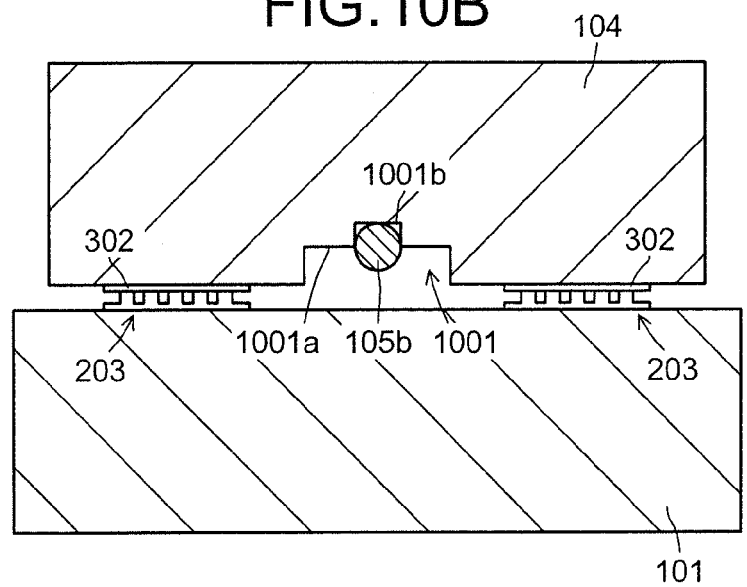

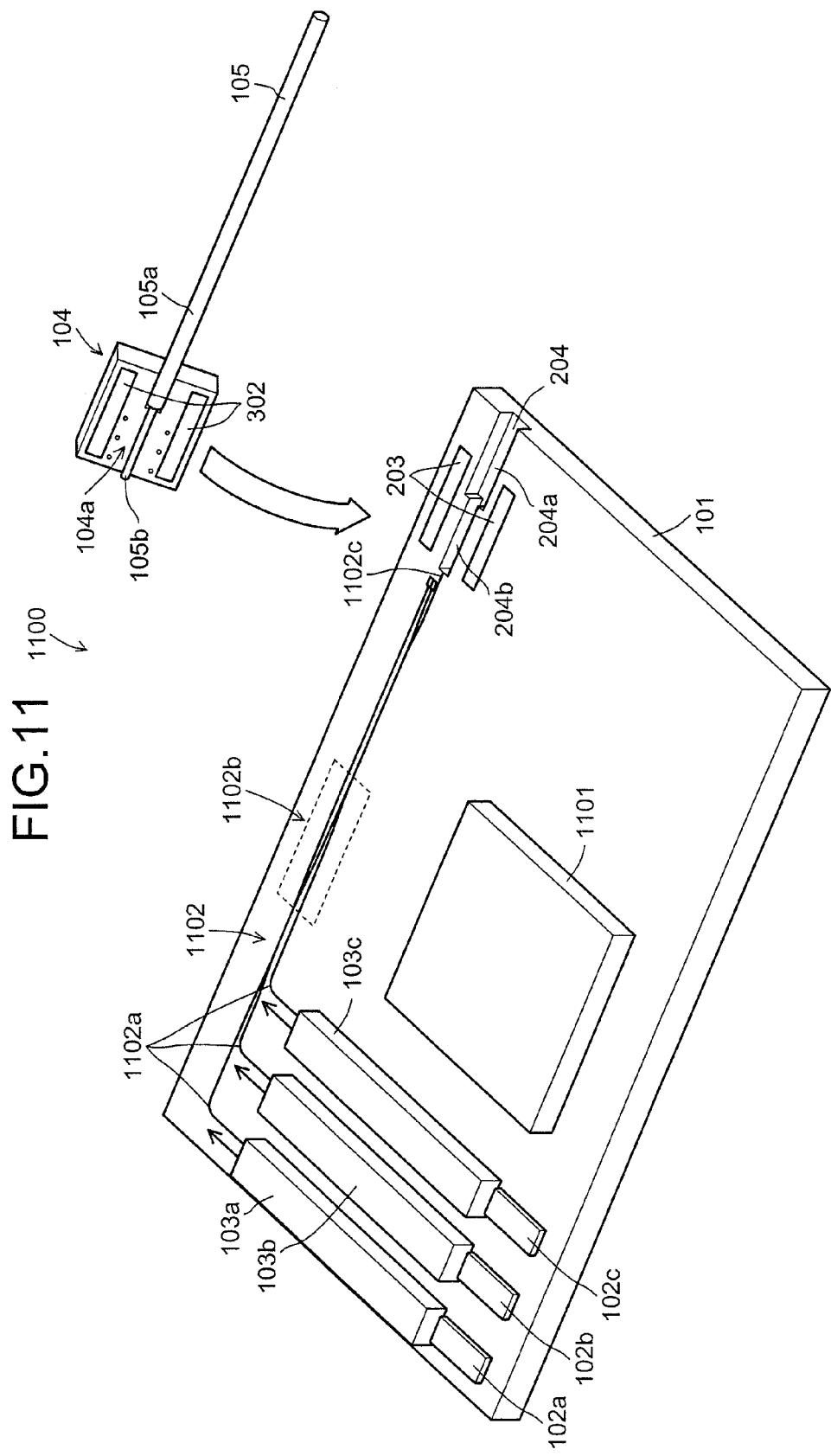

OPTICAL MODULE

BACKGROUND OF THE INVENTION

1. Field of the Invention

The present invention relates to mounting an optical element onto a mounting substrate, and an optical module that optically couples the optical element and an optical fiber.

2. Description of the Related Art

High optical coupling efficiency and low loss are demanded of optical modules that couple optical fibers and optical elements such as light emitting elements and light receiving elements. Thus, mounting that includes high-precision optical axis alignment is required.

As one such optical coupling structure, for example, a configuration has been disclosed where a V-groove is formed on a substrate. An optical fiber is run along the V-groove and fixed in the V-groove through a support guide substrate. By disposing an edge-emitting type light emitting element array at an end of the optical fiber and the side of the support guide, the optical fiber and the light emitting element are optically coupled along the optical axis running in direction along the length of the V-groove (see, for example, Japanese Patent Laid-Open Publication No. H8-201664).

Nonetheless, with the technology above, since both the light emitting element array and the optical fiber are structures mounted on the V-groove of the substrate, optical axis alignment with respect to all 3 directions along X, Y, and Z axes is required. The optical fiber is accommodated inside the V-groove, while the light emitting element array is mounted on the V-groove. However, even if the optical axis of the center (core) of the optical fiber is along the X axis, positioning of the light emitting element array disposed on the V-groove is not performed using the V-groove and therefore, optical axis alignment with respect to the X, Y, and Z axes is required between the optical fiber and the light emitting element array.

Since a V-groove such as that above accommodates an optical fiber along the X axis, from the perspective of the optical fiber alone, there is, conversely, no degree of freedom with respect to the Y and Z axes, making optical axis alignment by moving the optical fiber side difficult. The V-groove, when disposed in parallel and in plural to accommodate multiple optical fibers, is suitable for optical coupling between the optical axes of the optical fibers and the light emitting element array disposed at the pitch of the V-groove. However, with respect to alignment of an optical fiber and an optical element along a single optical axis, consequent to the limited degree of freedom, the V-groove is unsuitable for high-precision optical coupling.

Additionally, for a structure where in addition to a light emitting element, a wavelength converter element, for example, is disposed as an optical element mounted to an optical module, the number of optical coupling sites increases, whereby an equivalent number of optical axis alignments becomes necessary.

In the description above, although optical coupling of optical fibers and optical elements has been described, when an optical waveguide is formed on a substrate, and the optical waveguide and an optical fiber are optically coupled, easy and high-precision optical axis alignment of the optical waveguide and the optical fiber is desirable in this case as well. Furthermore, for reductions in the size of an apparatus that includes the optical module, fewer components and an overall smaller size are preferable.

To solve the problems related to the conventional technologies above, one object of the present invention is to provide an optical module that enables high-precision assembly by a simple configuration and reductions in size.

SUMMARY OF THE INVENTION

To solve the problems above and achieve an object, an optical module includes a mounting substrate, an optical element mounted on the mounting substrate, an optical fiber, and a support member that supports the optical fiber, where a surface of the support member supports the optical fiber, opposes and is mounted to the mounting substrate, optically coupling the optical element and the optical fiber. The support member has an anchoring groove of a given length and fixing an end of the optical fiber. A coupling position where an output end of the optical element and an input end of the optical fiber are optically coupled by mounting of the support member to the mounting substrate is provided at an internal position of a given distance from an end of the mounting substrate. An adjusting groove of a depth for preventing contact of the optical fiber with the mounting substrate is provided between the optical fiber supported by the support member and the mounting substrate.

BRIEF DESCRIPTION OF THE DRAWINGS

FIG. 6 is a diagram depicting a configuration of an alignment and mounting apparatus;

FIG. 7 is a diagram depicting positional relationships between the LD element and the wavelength converter element;

FIG. 8 is a graph depicting the relationship between the output voltage of a detector and the load applied by the alignment and mounting device;

FIG. 10A is a sectional front view depicting another configuration example of the sub-substrate of the optical module according to the first embodiment;

FIG. 10B is a sectional front view depicting the sub-substrate bonded to the mounting substrate;

FIG. 11 is a perspective view of the optical module according to a second embodiment.

DETAILED DESCRIPTION OF THE PREFERRED EMBODIMENTS

With reference to the accompanying drawings, preferred embodiments of an optical module according to the present invention are described in detail below.
(First Embodiment)
(Configuration of Optical Module)

Figure 1:
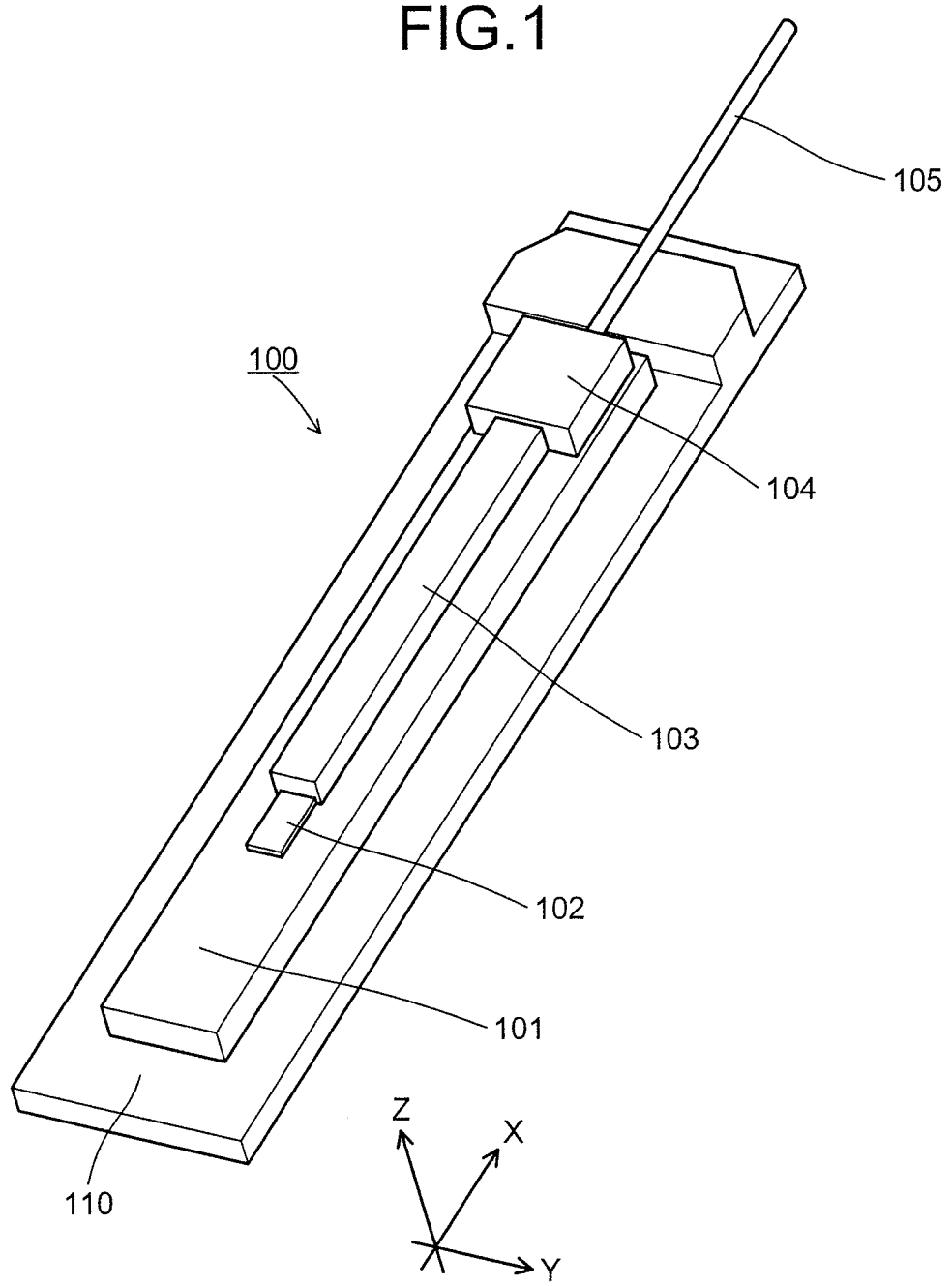
FIG. 1 is a perspective view of an optical module according to a first embodiment.

FIG. 1 is a perspective view of an optical module according to a first embodiment. An optical module 100 is configured to include a plate-shaped mounting substrate 101, optical elements 102 and 103 mounted on the mounting substrate 101, a block-shaped sub-substrate (support member) 104, and a single-mode (SM) optical fiber 105. The mounting substrate 101 is provided on a frame 110.

A silicon substrate is used as the mounting substrate 101. A silicon substrate or a glass substrate is used as the sub-substrate 104. A laser diode (LD) element 102 and a wavelength converter element (e.g., Periodically Poled Lithium Niobate (PPLN)) 103 for performing wavelength conversion of light emitted from the LD element 102 are mounted on the mounting substrate 101 as optical elements.

In the optical module 100 of the configuration above, for example, near-infrared light of a wavelength of 1064 nm emitted from the LD element 102 is converted at the wavelength converter element 103, to green laser of a wavelength of 532 nm and emitted.

The sub-substrate 104 holds an end of the optical fiber 105 and is bonded to the mounting substrate 101. With the sub-substrate 104 bonded to the mounting substrate 101, the end of the optical fiber 105 is directly, optically coupled to the wavelength converter element 103. The end of the optical fiber 105 may be configured to be provided integrally with a GI lens as coupling member.

Figure 2:
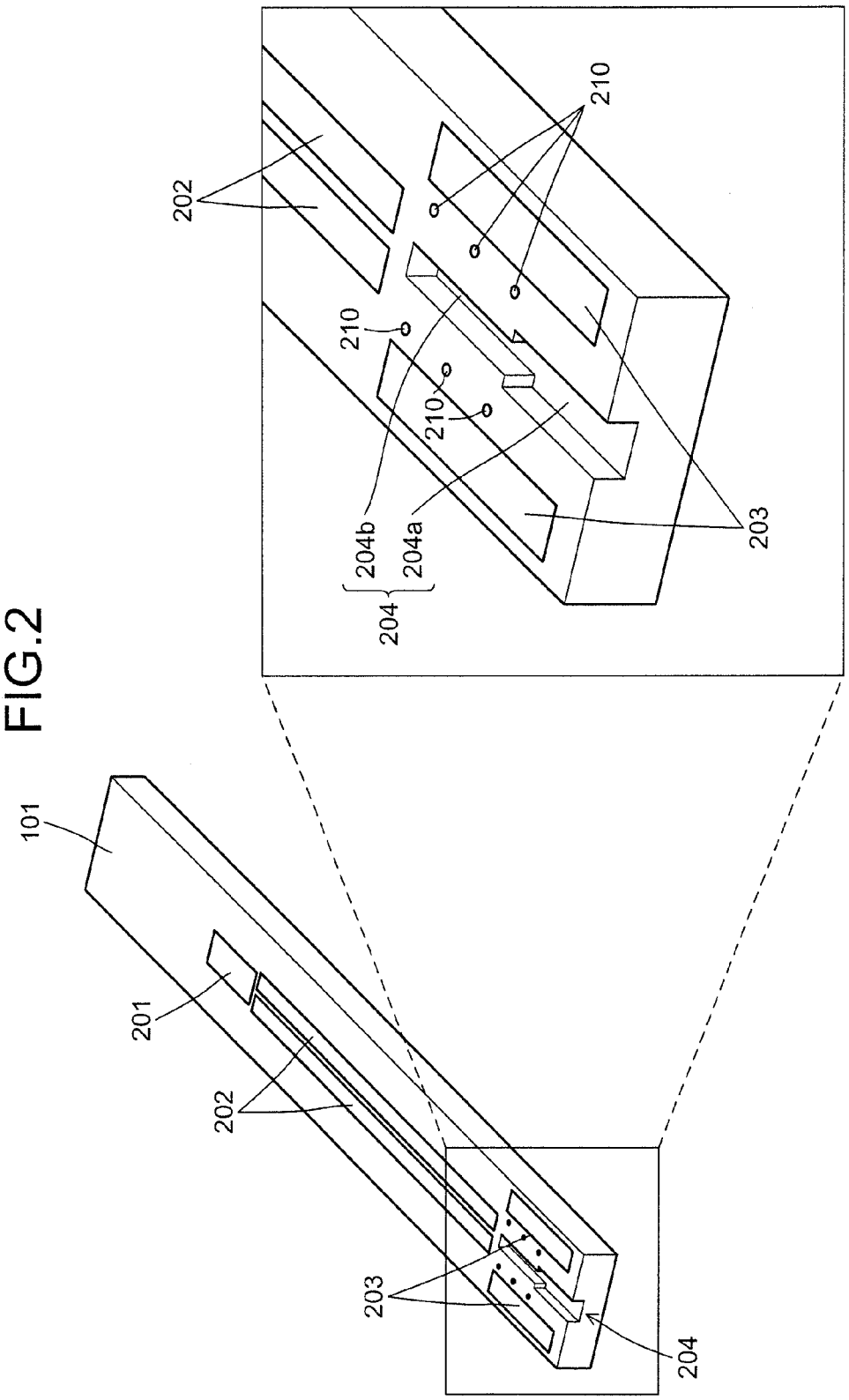
FIG. 2 is a perspective view of a mounting substrate of the optical module according to the first embodiment.

FIG. 2 is a perspective view of the mounting substrate of the optical module according to the first embodiment. In an upper surface of the mounting substrate 101, an LD mounting pattern 201, a wavelength converter element mounting pattern 202, and optical fiber mounting patterns 203 are provided. The LD mounting pattern 201 to the optical fiber mounting patterns 203 are electrically conductive patterns formed of a metal such as gold (Au). By a fabrication method described hereinafter, numerous minute protrusions (microbumps) are formed on the surface.

The LD mounting pattern 201 is of a size similar to that of the LD element 102 and is bonded to a lower surface of the LD element 102, fixing the LD element 102. The wavelength converter element mounting pattern 202 is provided in a shape of 2 lines that are parallel to an axis along the length of the wavelength converter element 103, and are bonded to an electrode of the wavelength converter element 103, electrically coupling and fixing the wavelength converter element 103. The optical fiber mounting patterns 203 are patterns for fixing the sub-substrate 104 onto the mounting substrate 101 and as depicted, have a given interval at an end of the mounting substrate 101 and are provided at 2 sites.

At the end of the mounting substrate 101 and between the optical fiber mounting patterns 203, a fiber adjusting groove 204 is formed. The fiber adjusting groove 204 has a diameter that is greater than the outer diameter of the optical fiber 105. The depicted fiber adjusting groove 204 has a first groove 204a of a diameter (width and depth) that is greater than the diameter of the optical fiber 105 (outer diameter of coating) and a second groove 204b of a diameter (width and depth) that is greater than the diameter of a functional region (core+cladding) of the optical fiber 105. For example, the depth of the first groove 204a is on the order of 200 μm. The first groove 204a is formed from the end of the mounting substrate 101 parallel to the optical axis (X axis); and the second groove 204b, connected to the first groove 204a, is formed to an end position of the wavelength converter element mounting pattern 202. The fiber adjusting groove 204 is formed by processing of the mounting substrate 101, such as by etching.

Multiple alignment marks 210 for positioning the sub-substrate 104 are formed in proximity to the optical fiber mounting pattern 203, at a given pitch.
(Configuration of Sub-Substrate)

Figure 3A:
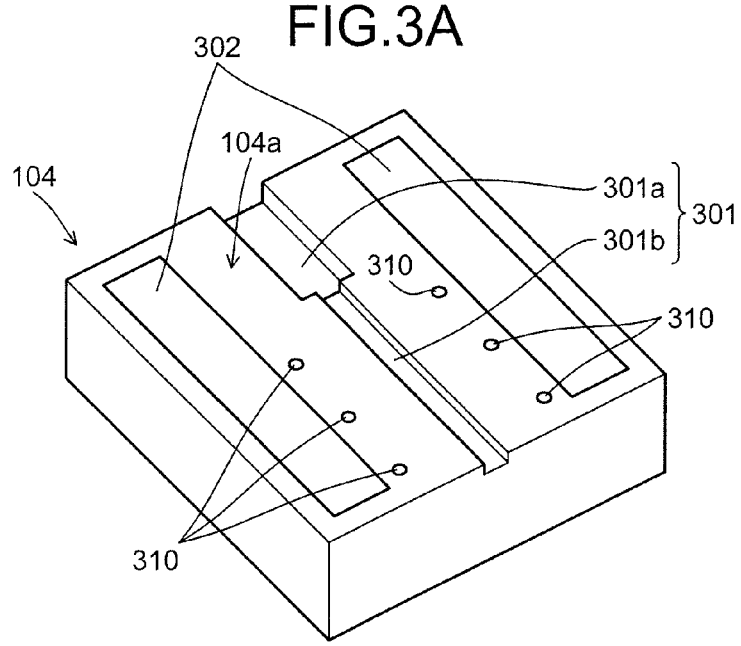
FIG. 3A is a perspective view of a sub-substrate of the optical module according to the first embodiment.

FIG. 3A is a perspective view of the sub-substrate of the optical module according to the first embodiment. The sub-substrate 104 has a fiber anchoring groove 301 that is parallel to the X axis and formed in a bonding surface 104a bonded to the mounting substrate 101. The fiber anchoring groove 301 has a first groove 301a of a diameter (width and depth) that is approximately the diameter (outer diameter of coating) of the optical fiber 105 and a second groove 301b of a diameter (width and depth) that is approximately the diameter of the cladding of the optical fiber 105. The fiber anchoring groove 301 is formed by processing of the sub-substrate 104, such as by etching. Since the second groove 301b fixes and holds the optical fiber 105, the groove shape is not limited to the concave side view shape depicted and may be a V-shaped groove.

In the sub-substrate 104, a bonding pattern 302 is formed on both sides of the fiber anchoring groove 301. The bonding patterns 302 are electrically conductive patterns formed of a metal such as Au and are provided corresponding to the positions of the optical fiber mounting patterns 203 provided on the mounting substrate 101. Multiple alignment marks 310 are formed in proximity of the bonding patterns 302, at a given pitch. The alignment marks 310 are at the same pitch as the alignment marks 210 on the mounting substrate 101 and are used to position the sub-substrate 104 with respect to the mounting substrate 101.

Figure 3B:
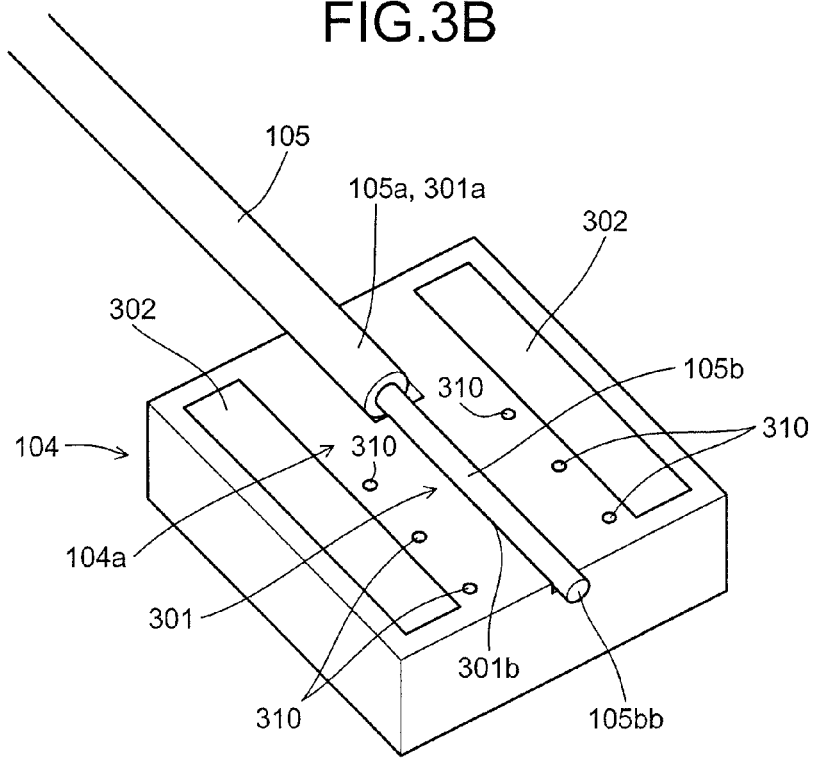
FIG. 3B is a perspective view of an optical fiber fixed to the sub-substrate.

FIG. 3B is a perspective view of the optical fiber fixed to the sub-substrate. In the fiber anchoring groove 301 of the sub-substrate 104, coating 105a of the optical fiber 105 is fixed in the first groove 301a portion and the cladding 105b of the optical fiber 105 is fixed in the second groove 301b portion. An adhesive such as resin is used for this fixation. During fixation, the end of the optical fiber 105, i.e., an end 105bb of the cladding 105b is preferably fixed to at least protrude beyond the end of the sub-substrate 104 as depicted.
(Method of Forming Mounting Pattern on Mounting Substrate)

Figure 4A:
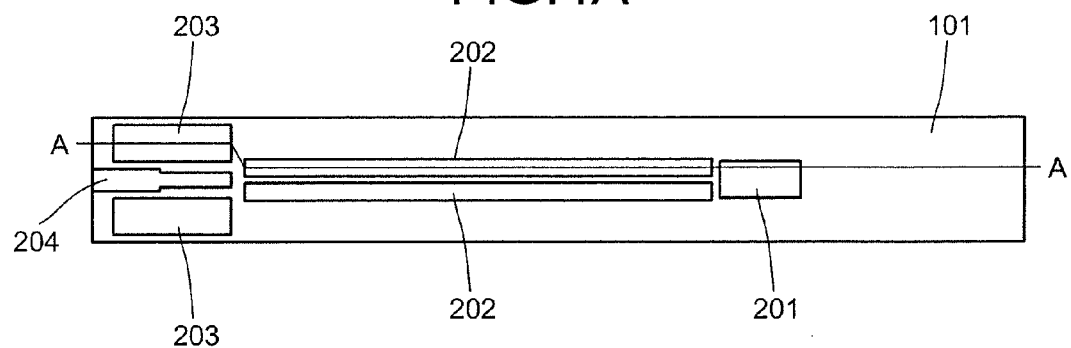
FIG. 4A is a plane view of the mounting substrate.

A fabrication method of the mounting patterns for the mounting substrate 101 will be described. FIG. 4A is a plane view of the mounting substrate. FIGS. 4B to 4F are respectively sectional side views depicting the formation process of the mounting substrate. FIGS. 4B to 4F are sectional views along line A-A depicted in FIG. 4A. Methods of forming the LD mounting pattern 201, the wavelength converter element mounting pattern 202, and the optical fiber mounting pattern 203 will be described sequentially.

Figure 4B:
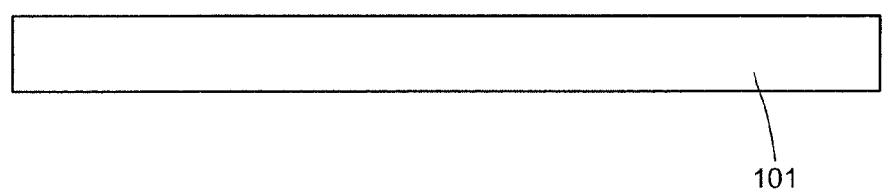
FIG. 4B is a sectional side view depicting a formation process of the mounting substrate (part 1)
Figure 4C:
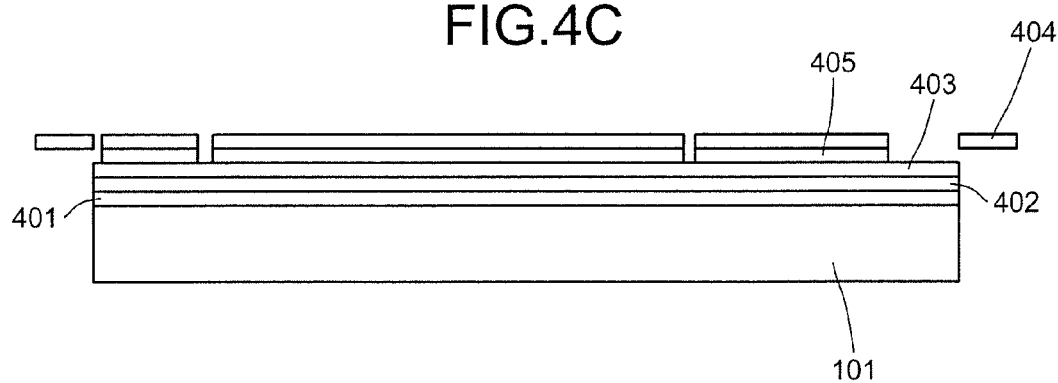
FIG. 4C is a sectional side view depicting the formation process of the mounting substrate (part 2)

First, as depicted in FIG. 4B, using a silicon substrate, the mounting substrate 101 is formed. Next, as depicted in FIG. 4C, after forming a silicon dioxide (Sio2) film 401 on the entire upper surface of the mounting substrate 101, a titanium (Ti) film 402 is formed on the entire surface as a buffer. On top of the entire Ti film 402, an Au film 403 film is formed. For example, the Ti film 402 has a thickness on the order of 0.1 μm and the Au film 403 has a thickness on the order of 3 μm, and each are respectively formed by a method such as sputter deposition, vapor deposition, or plating. Subsequently, a resist 405 is applied to an upper portion of the Au film 403 and as depicted in FIG. 4A, a mask 404 having openings at portions exclusive of the positions of the mounting patterns (the LD mounting pattern 201, the wavelength converter element mounting pattern 202, and the optical fiber mounting pattern 203) is applied and a resist pattern (positive resist) corresponding to the openings in the resist 405 is formed by exposure and development.

Figure 4D:
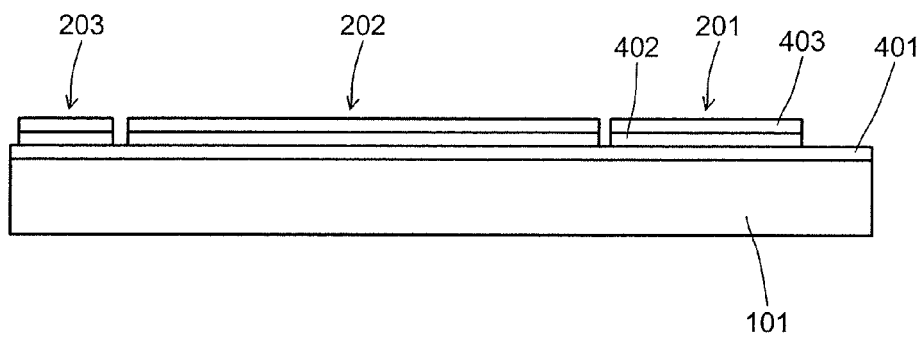
FIG. 4D is a sectional side view depicting the formation process of the mounting substrate (part 3)

As depicted in FIG. 4D, by removing the mask 404 and performing etching (dry or wet), the Au film 403 and the Ti film 402 form patterns and each of the mounting patterns (the LD mounting pattern 201, the wavelength converter element mounting pattern 202, and the optical fiber mounting pattern 203) are formed. Subsequently, the resist 405 removed. The alignment marks 210 for positioning the optical element mounted on the mounting substrate 101 are also simultaneously formed.

Figure 4E:
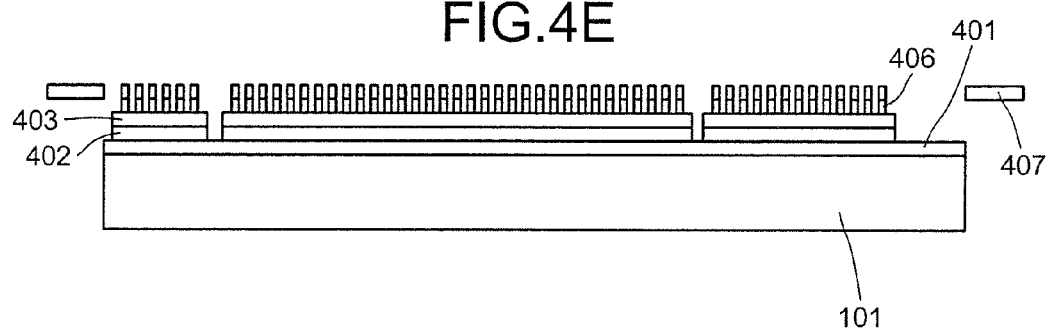
FIG. 4E is a sectional side view depicting the formation process of the mounting substrate (part 4)

As depicted in FIG. 4E, a resist 406 is applied on an upper portion of the Au film 403; and on the resist 406, a mask 407 for forming microbumps is applied. The mask 407 is formed to have minute, circular openings (e.g., φ5 μm) for forming the microbumps. By ultraviolet exposure, a resist pattern having openings corresponding to the microbumps is formed in the resist 406.

Figure 4F:
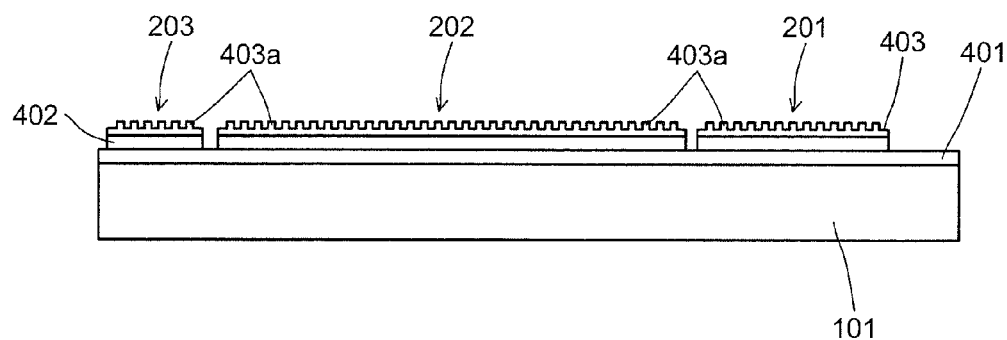
FIG. 4F is a sectional side view depicting the formation process of the mounting substrate (part 5)

Subsequently, as depicted in FIG. 4F, the mask 407 is removed and from the upper portion of the resist 406, halfetching is performed, whereby in the upper surface of the Au film 403 of the mounting patterns (the LD mounting pattern 201, the wavelength converter element mounting pattern 202, and the optical fiber mounting pattern 203), numerous minute circular microbumps 403a are formed having a given depth oriented parallel to the dimension of thickness of the Au film 403. Subsequently, the resist 406 is removed and fabrication is completed.

The microbumps 403a are circular, cylindrical protrusions of a diameter of 5 μm and a height if 2 μm, and are disposed symmetrically at a 10 to 25 μm pitch. The shape, height, width, pitch, etc. of the protrusions are 1 example and are not limited hereto. The microbumps 403a are formed by halfetching in the Au film 403, which is formed by a method such as sputter deposition, vapor deposition, or plating; therefore, the height of each of the protrusions among the microbumps 403a can be made uniform with high precision.

(Mounting of Optical Element with Respect to Mounting Substrate)

In mounting the optical element, an inert layer covering the upper surface of the microbumps 403a such as an oxide film or a contaminant is removed by a plasma cleaning process, thereby activating the upper surface. Activation enables atoms of high surface energy to come into contact, whereby adhesive forces between the atoms can be used to create strong bonds at normal ambient temperatures. This bonding method does not require special heating and therefore, displacement of components consequent to residual stress from thermal expansion coefficient differences is suppressed and mounting with high-precision positioning can be performed. Further, component damage consequent to residual stress from thermal expansion coefficient differences is also suppressed and thus, without stress on the components, advantages such as minimal deterioration of function are afforded.

Figure 5A:
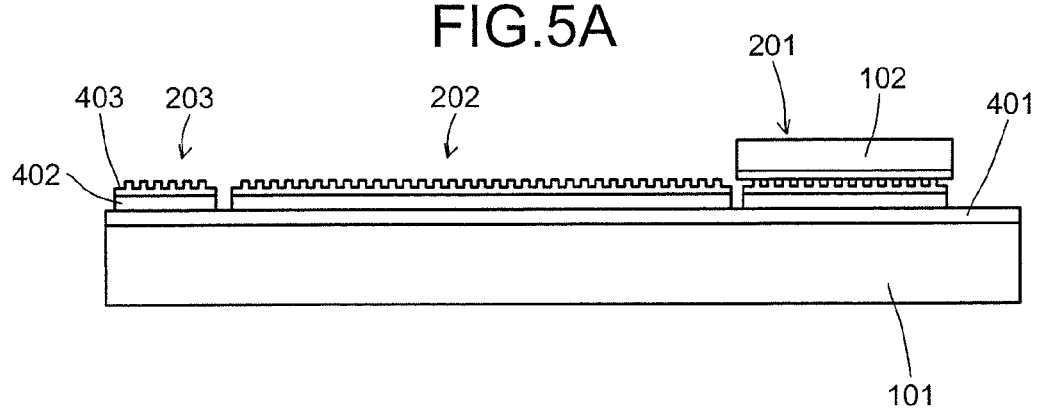
FIG. 5A is a sectional side view depicting mounting of an LD element with respect to the mounting substrate.

FIG. 5A is a sectional side view depicting mounting of the LD element with respect to the mounting substrate. As depicted, the LD element 102 is mounted on the surface activated microbumps 403a that are on the LD mounting pattern 201. An Au film is formed on the bonding surface of the LD element 102 and an upper surface of the Au layer has been subject to activation processing. Therefore, a given load is added to the upper portion of the microbumps 403a and by merely mounting the LD element 102, the LD element 102 forms a surface activated bond on the microbumps 403a and is fixed. Here, alignment marks (not depicted) are formed in a lower surface of the LD element 102 and using the alignment marks 210 on the mounting substrate 101 side as a reference, the LD element 102 is positioned with respect to the X and Y axes. The LD element 102 can be configured to receive the supply of a drive current via the microbumps 403a. In this case, given patterning for drive current supply is prepared in the Au film 403 for forming the microbumps 403a.

Mounting of the LD element 102 is performed by a non-depicted mounting device that mounts electronic components onto a circuit board. Mounting of the LD element 102 is performed using an alignment and mounting apparatus.

Figure 5B:
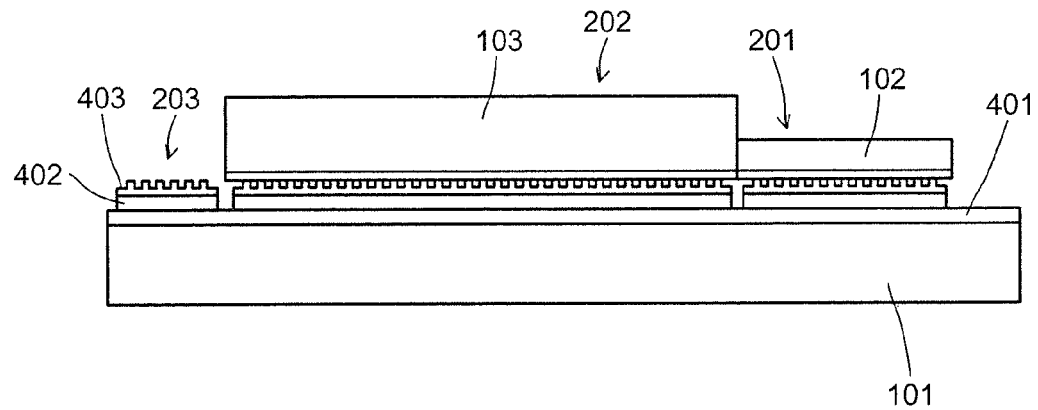
FIG. 5B is a sectional side view depicting mounting of a wavelength converter element with respect to the mounting substrate.

FIG. 5B is a sectional side view depicting mounting of the wavelength converter element with respect to the mounting substrate. The wavelength converter element 103 is aligned and mounted on the surface activated microbumps 403a of the wavelength converter element mounting pattern 202, ending the processing. An Au film is also formed on a bonding surface of the wavelength converter element 103 and an upper surface of the Au film is subject to activation processing. Therefore, a given load is added to the upper portion of the microbumps 403a and by merely mounting the wavelength converter element 103, the wavelength converter element 103 pushes the microbumps 403a and the wavelength converter element mounting pattern 202 is fixed by surface activated bonding. During alignment of the wavelength converter element 103, alignment marks (not depicted) are formed in a lower surface of the wavelength converter element 103 and using the alignment marks 210 on the mounting substrate 101 side as a reference, the wavelength converter element 103 is positioned with respect to the X and Y axes.

FIG. 6 is a diagram depicting a configuration of the alignment and mounting apparatus. Description will be given with reference to an enlarged view of a portion of FIG. 5B. The alignment mounting above can be performed using an alignment and mounting apparatus 600. The alignment and mounting apparatus 600 is configured to include a control unit 601 configured by a PC that includes a CPU and given memory; a detecting unit 602 that detects the power of the laser light, which has been wavelength converted and output from the wavelength converter element 103, and that outputs detection output voltage V (mV) according to the detected power; an alignment and mounting device 603 that mounts the optical element at a given position on the mounting substrate 101 and at the time of mounting, can add a load (N) according to the amount of control; and a drive unit 604 that is for driving the LD element 102 and causing the emission of laser light.

The control unit 601 controls the drive unit 604, causes the LD element 102 to operate and input laser light to the wavelength converter element 103, and detects by the detecting unit 602, the power of the laser light that is emitted from the wavelength converter element 103 and subject to wavelength conversion. While monitoring the detection output voltage V output by the detecting unit 602, the control unit 601 controls the alignment and mounting device 603 and controls the load applied to the wavelength converter element 103.

FIG. 7 is a diagram depicting positional relationships between the LD element and the wavelength converter element. Laser light of wavelength λ1 emitted from a light emission center 102A of the LD element 102 is input from an input position 103A of the wavelength converter element 103, is converted to laser light of wavelength λ2 and output from an output light center 103B of the wavelength converter element 103. As depicted in FIG. 6, the LD element 102 and the wavelength converter element 103 are mounted on the mounting substrate 101 by the alignment and mounting device 603 and therefore, the positional relation on a plane (positional relation on the XY plane) of the light emission center 102A of the LD element 102 and the input position 103A of the wavelength converter element 103 are positioned with favorable precision. However, the positional relationship with respect to an axis parallel to the height of the mounting substrate 101 (direction of Z axis) has to be established with favorable precision. In FIG. 7, an arrow A indicates the direction of load applied to the wavelength converter element 103 by the alignment and mounting device 603.

FIG. 8 is a graph depicting the relationship between the output voltage of the detector and the load applied by the alignment and mounting device. In FIG. 8, curve B represents the relationship between the output voltage (mV) of the detecting unit 602 and the load (N) applied by the alignment and mounting device 603, when the load is being applied. Curve C represents the relationship between the output voltage (mV) of the detecting unit 602 and the final load (N) by the alignment and mounting device 603, after the load is released. In the example depicted in FIG. 8, in a state when load is being applied, in the case of a load of 400 (N), the output voltage (mV) of the detecting unit 602 becomes the maximum value (see point D). However, after the load is released, in a case when the final load is 400 (N), the output voltage (mV) of the detecting unit 602 does not become the maximum value (see point E).

Point D, for example, corresponds to a case where the load is released during a state when consequent to load being applied to the wavelength converter element 103, the microbumps 403a become deformed, and the input position 103A of the wavelength converter element 103 and the light emission center 102A of the LD element 102 are at positions for the most efficient optical coupling (see position P2 in FIG. 7). Although the microbumps 403a become deformed (become compressed) and contract when subjected to load, when the load is released, consequent to elastic rebound, a force that attempts to return to the original state comes into play. Thus, the microbumps 403a have a property of returning to the original state to the extent achieved by elastic rebound force. In other words, point E corresponds to a case where during the state indicated by point D, the load is released and consequent to elastic rebound, the input position 103A of the wavelength converter element 103 moves to another position (e.g., see position P1 in FIG. 7).

During the state when the load has been released (a state when the optical module 100 is actually used), the input position 103A of the wavelength converter element 103 has to be put at a position affording the most efficient optical coupling with the light emission center 102A of the LD element 102 (see position P2 in FIG. 7). Thus, in the alignment and mounting above, the control unit 601, after disposing the wavelength converter element 103 at a given position of the microbumps 403a, increases the load applied, and after the output voltage V from the detecting unit 602 has become the maximum value, applies a given load so that the microbumps 403a are further deformed and then, controls the alignment and mounting device 603 to release the load.

In other words, the control unit 601, after the output voltage V from the detecting unit 602 becomes the maximum value (see point D), a given load (F: 200 (N)) is further applied, and thereafter the load is opened. The given load F is further applied such that the input position 103A of the wavelength converter element 103 is pushed to a position (see position P3 in FIG. 7) farther in the direction of height (Z axis) than the light emission center 102A of the LD element 102, by a distance W1 depicted in FIG. 7. In other words, consequent to the release of the load, the input position 103A of the wavelength converter element 103 takes into consideration return to the position (see position P2 in FIG. 7) for the most efficient optical coupling with the light emission center 102A of the LD element 102, by the elastic rebound of the microbumps 403a.

The above given load (F: 200 (N)) differs depending on the alignment and mounting device 603, the shape of the wavelength converter element 103 subject to the load, the fabrication material and shape of the microbumps 403a, etc. and thus, can be calculated by the curves B and C depicted in FIG. 8 and obtained by experiment. Further, in the alignment and mounting, after the output voltage V from the detecting unit 602 has become the maximum, the control unit 601 controls the alignment and mounting device 603 such that a given load is applied. Nonetheless, the user, while observing on a monitor, the output voltage V from the detecting unit 602, may control the alignment and mounting device 603.

(Alignment and Bonding of Sub-Substrate with Optical Fiber to Mounting Substrate)

Figure 9A:
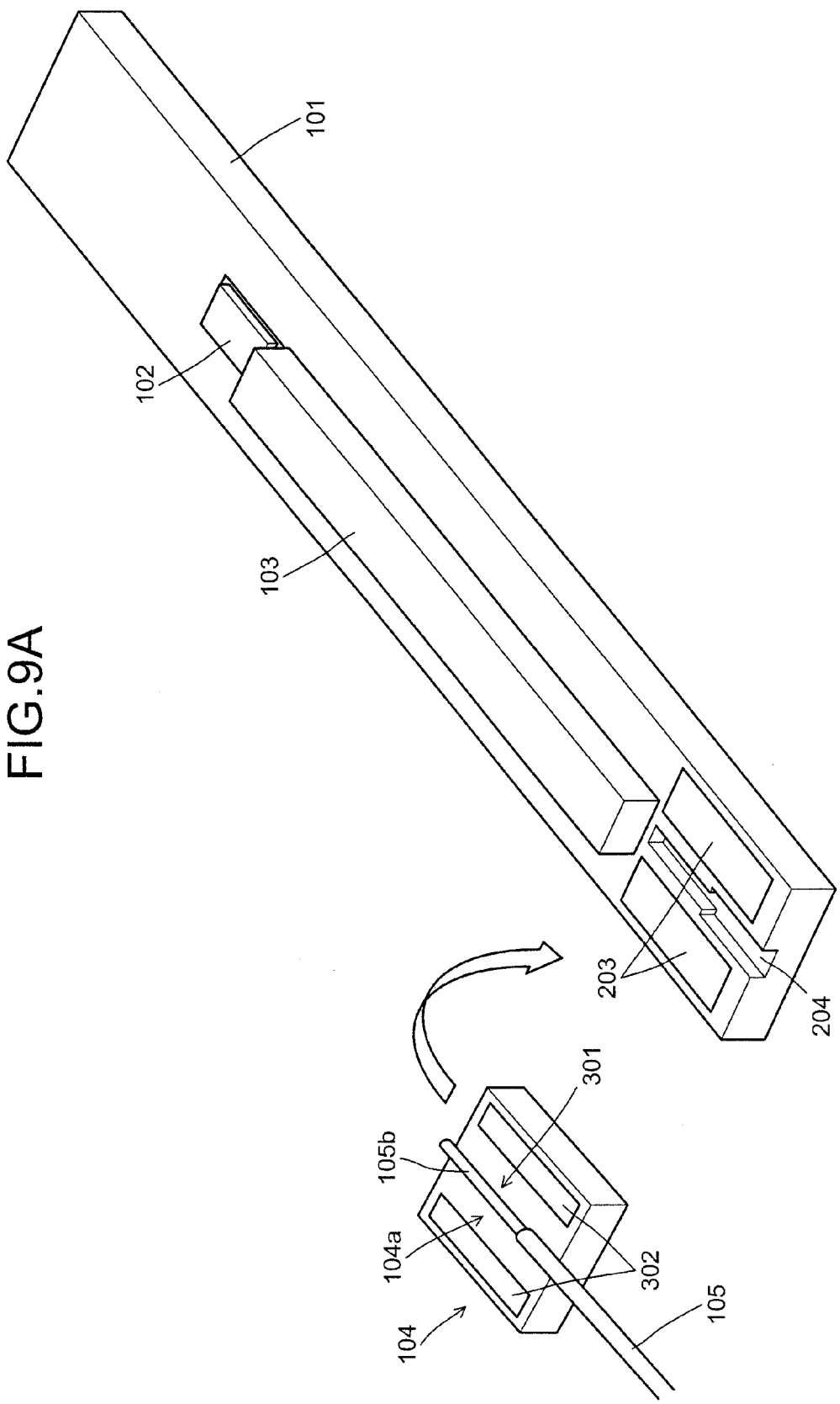
FIG. 9A is a perspective view of the mounting substrate and the sub-substrate to which an end of the optical fiber is fixed and held.

Alignment and bonding/fixation of the optical fiber with respect to the mounting substrate will be described. FIG. 9A is a perspective view of the mounting substrate and the sub-substrate to which an end of the optical fiber is fixed and held. The mounting substrate 101 depicted in FIG. 2 and the sub-substrate 104 depicted in FIG. 3B are depicted. On the mounting substrate 101, the LD element 102 and the wavelength converter element 103 are mounted. The optical fiber 105 is fixed to the bonding surface 104a side of the sub-substrate 104. As depicted, the sub-substrate 104, with the bonding surface 104a side (where the optical fiber 105 is provided) opposing the mounting substrate 101, is attached to the end of the mounting substrate 101, i.e., at the light output position of the wavelength converter element 103.

Figure 9B:
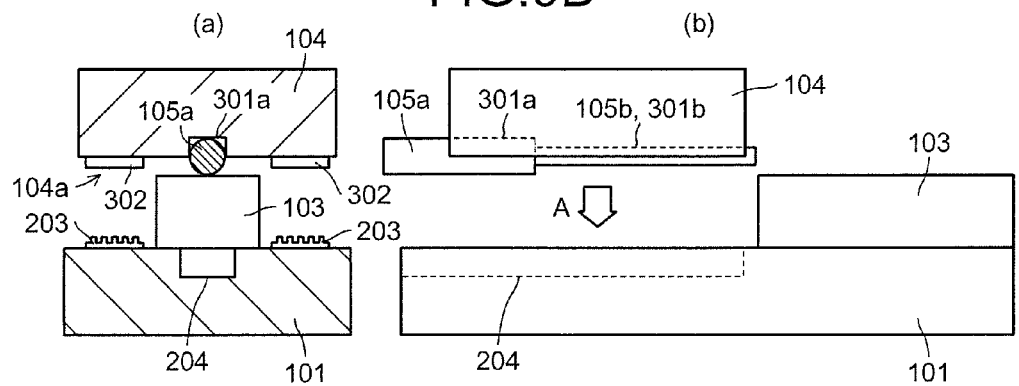
FIG. 9B is a diagram depicting alignment of the sub-substrate (part 1)
Figure 9C:
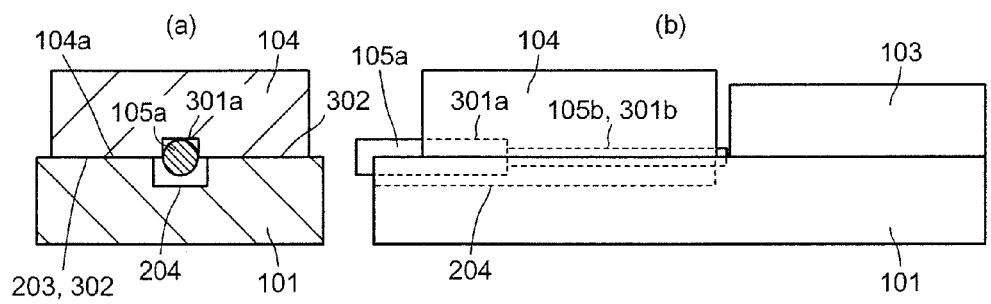
FIG. 9C is a diagram depicting alignment of the sub-substrate (part 2)

FIGS. 9B and 9C are diagrams depicting the alignment of the sub-substrate. In these diagrams, section (a) is a sectional from view and section (b) is a sectional side view. For the sake of simplicity, section (a) of only FIG. 9B depicts the optical fiber mounting pattern 203 and the bonding pattern 302. Similar to the mounting of the wavelength converter element 103 with respect to the mounting substrate 101, the mounting of the sub-substrate 104 is also fixed by surface activated bonding. First, positioning in planar directions (X and Y axes) of the sub-substrate 104 is performed by detecting the positions of the alignment marks 310 of the sub-substrate 104 with respect to the alignment marks 210 (see FIG. 2) on the mounting substrate 101 via image recognition, while monitoring output after optical coupling of the optical fiber 105 with respect to the output light of the wavelength converter element 103 (active alignment). For instance, the mounting is performed using the alignment and mounting apparatus 600 described with reference to FIG. 6, and the control unit 601 controls the drive unit 604, causes operation of the LD element 102 and input of laser light to the wavelength converter element 103, and detects the power of the laser light of the optical fiber 105 by the detecting unit 602.

After completion of position adjustment in the planar directions, load is applied to the sub-substrate 104. An arrow A indicates the direction that the load is applied to the sub-substrate 104 by the alignment and mounting apparatus 600.

In the bonded state depicted in FIG. 9C, although the optical fiber mounting pattern 203 and the bonding pattern 302 are omitted, consequent to the application of load to the sub-substrate 104, the bonding pattern 302 of the sub-substrate 104 contacts the optical fiber mounting pattern 203. The microbumps 403a (see FIG. 5B) on the optical fiber mounting pattern 203 gradually become compressed according to the load and the height of the optical fiber 105 gradually lowers. Consequently, the optical coupling state of the optical fiber 105 with respect to the wavelength converted laser light output from the wavelength converter element 103 varies, whereby the optical power detected by the alignment and mounting apparatus 600 varies, and the core center of the optical fiber 105 is aligned in the direction of height (a direction parallel to the Z axis).

During the surface activated bonding of the sub-substrate 104 with respect to the mounting substrate 101, load is applied until the position that takes the elastic rebound of the microbumps 403a into consideration is reached. Further, the given load differs depending on the alignment and mounting apparatus 600, the shape of the sub-substrate 104 subject to the load, the fabrication material and shape of the microbumps 403a, etc., and thus, can be calculated by performing an experiment for the sub-substrate 104 similar to that performed for the wavelength converter element 103 depicted in FIG. 8. Therefore, during the state when the load has been released (a state when the optical module 100 is actually used), the position of the core of the optical fiber 105 can be placed at a position for which optical coupling with the light output position of the wavelength converter element 103 is most efficient.

As depicted in FIG. 9C, a lower half portion of the coating 105a and the cladding 105b of the optical fiber 105 fixed to the sub-substrate 104 protrudes beyond the mounting substrate 101 end. However, as depicted in FIG. 2, the fiber adjusting groove 204 of a diameter that is greater than the diameter of the optical fiber 105 is formed in the mounting substrate 101. The first groove 204a of the fiber adjusting groove 204 has a diameter that is greater than the diameter of the optical fiber 105 (outer diameter of the coating 105a) and the second groove 204b has a diameter that is greater than the diameter of the cladding 105b of the optical fiber 105. By the fiber adjusting groove 204, without the hindrance of moving the optical fiber 105 during positional adjustment with respect to the above planar directions (X and Y axes), positional adjustments can be performed easily.

(Another Configuration Example of Sub-Substrate)

FIGS. 10A and 10B are sectional front views depicting another configuration example of the sub-substrate of the optical module according to the first embodiment. The depicted sub-substrate 104 has a configuration of a fiber anchoring groove 1001 that differs. The fiber anchoring groove 1001 is similar to the configuration example above in that the fiber anchoring groove 1001 is formed along the direction of the X axis in the bonding surface 104a that is bonded to the mounting substrate 101. In FIG. 10A, an adjusting groove of a depth greater than the diameter (height portion) of the optical fiber 105 to be fixed, is formed in the fiber anchoring groove 1001 of the sub-substrate 104.

For instance, the fiber anchoring groove 1001 has at least a first groove 1001a having a diameter that is greater than or equal to the diameter of the cladding 105b of the optical fiber 105 and a second groove 1001b having a diameter (width and depth) on the order of half of the diameter of the cladding 105b of the optical fiber 105. The fiber anchoring groove 1001 is formed in the sub-substrate 104 by a process such as etching. The second groove 1001b fixes and holds the cladding 105b of the optical fiber 105. An adhesive such as resin is used for the fixation. Consequently, the shape of the groove of the second groove 1001b is not limited to the concave side view shape depicted and may be a V-shape.

The bonding pattern 302 is formed in the sub-substrate 104, on both sides of the fiber anchoring groove 1001. The bonding pattern 302 is an electrically conductive pattern formed of a metal such as Au and provided corresponding to the arrangement position of the optical fiber mounting pattern 203 provided on the mounting substrate 101.

FIG. 10B is a sectional front view depicting the sub-substrate bonded to the mounting substrate. As depicted, although the optical fiber 105 has a height (diameter) where the lower portion of the optical fiber 105 protrudes from the second groove 1001b, because the first groove 1001a is of a height having some margin with respect to the diameter of the optical fiber 105, the optical fiber 105 does not contact the mounting substrate 101.

Consequently, without the hindrance of moving the optical fiber 105 during the positional adjustment with respect to the above planar directions (X and Y axes), positional adjustment can be performed easily. Further, according to the configuration in which the fiber anchoring groove 1001 is provided in the sub-substrate 104, the fiber anchoring groove 1001 need only be provided in the sub-substrate 104 side and formation of the fiber adjusting groove 204 in the mounting substrate 101 side is not necessary.

According to the configuration of the first embodiment described, on a single mounting substrate 101, 3 types of components (optical elements) including the LD element 102, the wavelength converter element 103m and the optical fiber 105 are directly bonded. In this manner, by mounting multiple components onto the single mounting substrate 101, the component count of the optical module overall can be reduced, enabling reductions in unit cost.

Further, since all components (optical elements) can be formed for direct optical coupling, for example, without a need for providing a separate, independent lens between the wavelength converter element 103 and the optical fiber 105, the component count of the optical module overall can be reduced, enabling reductions in the overall size. Since optical components can be directly coupled, without a need for the use of excessive jigs, the precision of alignment between optical components can be improved, enabling optical coupling efficiency to be improved. Furthermore, since each optical component can be mounted at normal ambient temperatures by surface activated bonding, mounting that is unaffected by heat can be performed, enabling the precision of alignment between optical components to be improved.

Since the fixation of the LD element 102, the wavelength converter element 103 and the optical fiber 105 are all mountings by surface activated bonding using the microbumps 403a, the number of mounting processes can be reduced and without using multiple mounting facilities, mounting can be performed using the same mounting apparatus (the alignment and mounting apparatus 600). By using adhesive jigs for each of the different optical elements (the LD element 102, the wavelength converter element 103, and the optical fiber 105 (the sub-substrate 104)) and by changing the bonding conditions, different optical elements can be mounted in plural using a single mounting apparatus.

Further, with conventional component assembly, a problem arises in that since the mounting apparatus differs for each component, if any of the mounting apparatuses stops, processes of fabrication overall stop. However, according to the configuration above, even if fabrication is suspended at the mounting of a given component, the adhesive jig is changed and the mounting of another component can be continued, enabling fabrication to be continued.

The coupling site where the wavelength converter element 103 and the optical fiber 105 (optical elements) are optically coupled is provided at an internal position of a given distance from the end of the mounting substrate 101. For example, as depicted in FIG. 9C, the optical fiber 105 is bonded to the bonding surface 104a of the sub-substrate 104 over the length (direction of optical axis) of the sub-substrate 104 and is inside the mounting substrate 101 up to the internal position of this length. Thus, since the end position of the mounting substrate 101 is not the optical coupling site, the optical fiber 105, which leads light to the exterior thereof, requires no adjustment at the end of the mounting substrate 101, enabling stable adjustment to be performed.

In other words, in the adjustment at the end of the mounting substrate 101, in contrast to instability consequent to an insufficient area bonding the portion supporting the optical fiber 105 and the mounting substrate 101, according to the first embodiment, since the optical fiber 105 is inserted up to the top of the mounting substrate 101, a given area on the mounting substrate 101 is established to enable stable bonding of the sub-substrate 104 and alignment with respect to the optical fiber 105, and the positioning after assembly can be held securely. Direct coupling without the need for a lens at the coupling site of the optical element and the optical fiber becomes possible, enabling reductions in size. Here, if configuration is such that the optical fiber 105 is fixed at the end of the mounting substrate 101, a member for fixing the optical fiber 105 to the end of the mounting substrate 101 becomes necessary and the extent that anchoring fixture protrudes at the end increases. However, according to the configuration above, without the formation of the anchor fixture portion protruding at the end of the mounting substrate 101, catching and snagging are suppressed, making handling easy and enabling reductions in size.

Consequent to the configuration of inserting the optical fiber 105 up to the top of the mounting substrate 101, the optical elements such as the wavelength converter element 103 are positioned internally and not at the end of the mounting substrate 101, whereby temperature adjustment of the optical elements can be performed efficiently and stably. At a lower portion of the mounting substrate 101, a non-depicted temperature adjusting element is provided, affording a configuration that controls the temperature of the mounting substrate 101. However, although temperature adjustment becomes more difficult toward the end of the mounting substrate 101, the thermal conductive characteristic of temperature control becoming easier toward the inside of the mounting substrate 101 can be efficiently used.

(Second Embodiment)
(Another Optical Module Configuration)

FIG. 11 is a perspective view of the optical module according to a second embodiment. An optical module 1100 according to the second embodiment is an example of a configuration of an RGB module that outputs RGB light. Therefore, 3 of the LD elements 102a to 102c for generating each of the 3 RGB colored lights and the wavelength converter elements 103a to 103c that convert the wavelengths of the light output from the LD elements 102a to 102c into R, G, and B wavelength light are provided on the mounting substrate 101. The LD elements 102a to 102c and the wavelength converter elements 103a to 103c are controlled by a driver IC 1101, which is also mounted on the mounting substrate 101.

On the mounting substrate 101, optical waveguides 1102 that guide the output light of the wavelength converter element 103a to 103c are formed. The optical waveguides 1102 guide the output light of the respective wavelength converter elements 103a to 103c internally enclosed and after the curve by the curved portion 1102a, couple each of the RGB wavelength lights by the coupling portion 1102b, and output the coupled RGB light from an output end 1102c.

At a portion of the output end 1102c of the mounting substrate 101, the sub-substrate 104 is attached. At this portion of the mounting substrate 101 to which the sub-substrate 104 is attached, the fiber adjusting groove 204 is formed. The depicted fiber adjusting groove 204, similar to the first embodiment, has the first groove 204a of a diameter (width and depth) that is greater than the diameter (outer diameter of coating) of the optical fiber 105 and the second groove 204b of a diameter (width and depth) that is greater than the cladding diameter of the optical fiber 105. Further, on both sides of the fiber adjusting groove 204, the optical fiber mounting patterns 203 are provided. Meanwhile, at the sub-substrate 104, the optical fiber 105 is fixed to the bonding surface 104a side. In the sub-substrate 104, the bonding patterns 302 are formed on both sides of the fiber anchoring groove 301.

Figure 12:
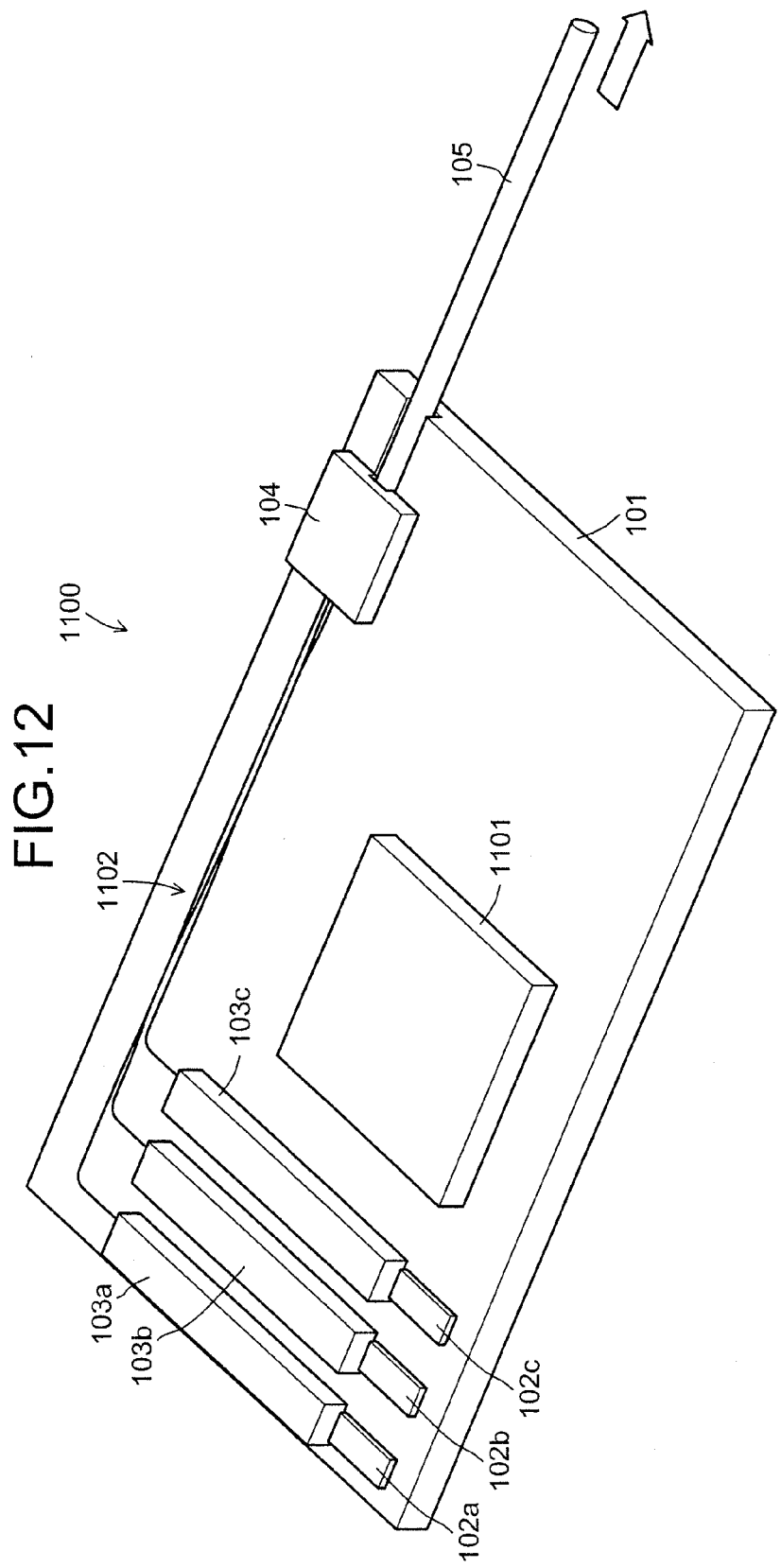
FIG. 12 is a perspective view depicting attachment of the sub-substrate.

FIG. 12 is a perspective view depicting attachment of the sub-substrate. As depicted, with the bonding surface 104a side to which the optical fiber 105 is provided opposing the mounting substrate 101, the sub-substrate 104 is attached to the end of the mounting substrate 101, i.e., at a position of the output end 1102c of the optical waveguides 1102. The mounting can be performed by the alignment and mounting apparatus 600 above. The attachment state of the sub-substrate 104 is a first example (similar to FIG. 9C) for which positioning adjustment can be performed easily by the fiber adjusting groove 204, without the hindrance of moving the optical fiber 105 during positional adjustment with respect to the above planar directions (X and Y axes).

The configuration of the sub-substrate 104, as depicted in FIG. 10A, can be a configuration in which the adjusting groove is provided only on the sub-substrate 104 side.

As described, the attachment of the optical fiber 105 can also be applied to an RGB module, and with respect to various types of the mounting substrate 101, can efficiently input the light output from the module into the optical fiber 105 using the sub-substrate 104 and guide the light to an external destination.

According to the second embodiment, on one mounting substrate 101, 4 types of elements (optical elements) including the plural LD elements 102a to 102c, the plural wavelength converter elements 103a to 103c, the optical waveguide 1102, and the optical fiber 105 can be directly bonded. Thus, in the second embodiment as well, the component count of the optical module overall can be reduced, enabling reductions in unit cost by performing the mounting with respect to one mounting substrate 101.

Further, since formation enabling all of the components to be directly optically coupled, optical elements for optical coupling such as a lens can be omitted, enabling the component count of the optical module overall to be reduced, further enabling reductions in the overall size. Since optical components can be directly coupled, without a need for the use of excessive jigs, the precision of alignment between optical components can be improved, enabling optical coupling efficiency to be improved. Furthermore, since each optical component can be mounted at normal ambient temperatures by surface activated bonding, mounting that is unaffected by heat can be performed, enabling the precision of alignment between optical components to be improved.

Since the fixation of the LD elements 102a to 102c, the wavelength converters element 103a to 103c, and the optical fiber 105 are all mountings by surface activation using the microbumps 403a, the number of mounting processes can be reduced and without using multiple mounting facilities, mounting can be performed using the same mounting apparatus (the alignment and mounting apparatus 600). By using adhesive jigs according to the different optical elements (the LD elements 102a to 102c, the wavelength converter elements 103a to 103c, and the optical fiber 105 (the sub-substrate 104)) and by changing the bonding conditions, different optical elements can be mounted in plural using a single mounting apparatus. In the configuration, since the optical waveguide 1102 is formed on the mounting substrate 101, by curving the shape of the optical waveguide 1102 and setting the length thereof, etc., the position of the output end of the light on the mounting substrate 101 can be set at an arbitrary position, enabling the layout of the optical elements on the mounting substrate 101 to be set freely. Furthermore, the overall size of the mounting substrate 101 can be reduced.

In the second embodiment as well, since the optical fiber 105 is inserted up to the top of the mounting substrate 101, a given area on the mounting substrate 101 is established to enable stable bonding of the sub-substrate 104 and alignment with respect to the optical fiber 105, and the positioning after assembly can be held securely. Consequent to the configuration of inserting the optical fiber 105 up to the top of the mounting substrate 101, the optical elements such as the optical waveguide 1102 are positioned internally and not at the end of the mounting substrate 101, whereby temperature adjustment of the optical elements can be performed efficiently and stably.

As described, an optical module according to the present invention includes a mounting substrate, an optical element mounted on the mounting substrate, an optical fiber, and a support member that supports the optical fiber. A surface of the support member supports the optical fiber, opposes and is mounted to the mounting substrate, optically coupling the optical element and the optical fiber, where the support member has an anchoring groove of a given length and fixing an end of the optical fiber, and a coupling position where an output end of the optical element and an input end of the optical fiber are optically coupled by mounting of the support member to the mounting substrate is provided at an internal position of a given distance from an end of the mounting substrate.

Consequent to the configuration above, an end of the optical fiber is fixed to the support member, the support member is mounted to the mounting substrate, and the location where the optical element and the optical fiber are optically coupled is on the mounting substrate and can be an internal position, not the end, enabling the optical element and the optical fiber to be coupled. Consequently, the optical fiber can be held securely in the mounting substrate and reductions in size can be achieved. Further, the position where the optical element is disposed on the mounting substrate can be an internal position, not the end, enabling temperature control of the optical element to be performed efficiently. Further, without the formation of the anchor fixture portion protruding at the end of the mounting substrate 101, catching and snagging is suppressed, making handling easy and enabling reductions in size.

An adjusting groove of a depth for preventing contact of the optical fiber with the mounting substrate is provided between the optical fiber supported by the support member and the mounting substrate.

Consequent to the configuration above, when the support member supporting the optical fiber is bonded to the mounting substrate, movement for alignment becomes easy to perform since the optical fiber does not contact the mounting substrate consequent to the adjusting groove provided at the position of the optical fiber of the mounting substrate.

The adjusting groove is provided in the mounting substrate.

Consequent to the configuration above, the optical fiber supported by the support member does not contact the mounting substrate and movement for alignment can be performed easily.

The adjusting groove is provided on the surface of the support member, supporting optical fiber.

Consequent to the configuration above, the optical fiber supported by the support member does not contact the mounting substrate and movement for alignment can be performed easily. Further, by formation of the groove on the support member side, the formation of a groove on the mounting substrate side is unnecessary.

The adjusting groove is formed by a groove that corresponds to a diameter of the coating of the optical fiber, and a groove that corresponds to a diameter of the functional region of the optical fiber.

Consequent to the configuration above, with respect to both the coating and the functional region of the optical fiber, respectively having differing diameters, no contact is made with the mounting substrate and movement for alignment can be performed easily.

The support member and the optical element are bonded to the mounting substrate by surface activated bonding.

Consequent to the configuration above, the optical element and the optical fiber supported by the support member can be easily bonded onto the mounting substrate by surface bonding, alignment can be performed easily, enabling high-precision optical coupling and since bonding can be performed at normal ambient temperatures, damage of the optical element can be prevented.

Alignment marks for aligning the support member and the mounting substrate are provided on the surface of the support member, supporting the optical fiber and the mounting substrate.

Consequent to the configuration above, positioning of the support member with respect to the mounting substrate can be performed easily.

The optical element includes a laser diode that outputs light of a given wavelength, and a wavelength converter element that wavelength converts the light of the given wavelength output from the laser diode.

Consequent to the configuration above, different optical elements can be mounted onto the mounting substrate and wavelength converted light can be output.

An optical waveguide that guides light output from the wavelength converter element to an input end of the optical fiber is included as the optical element.

Consequent to the configuration above, various types of optical element including an optical waveguide can be mounted on the mounting substrate. By curving the shape of the optical waveguide, setting the length thereof, etc., the position (on the mounting substrate) of an output end of the light can be set at an arbitrary position, the layout of the optical elements on the mounting substrate can be set freely, and the overall size of the mounting substrate can be reduced.

According to the optical module of the present invention, an optical element and optical fiber that enable size reductions and high-precision assembly and a simple structure can be optically coupled and mounted on the same plane on the mounting substrate.

As described, the optical module according to the present invention is suitable for an optical module that has a laser element and an optical element disposed downstream from the laser element and through which light is output and is particularly suitable for a light source used in an optical communication system and a display system such as a laser projector. A wavelength converter element such as a second harmonic generation (SHG) element, and modulation element are applicable as the optical element.

What is claimed is:

1. An optical module comprising:
   a mounting substrate,
   an optical element mounted on the mounting substrate,
   an optical fiber, and
   a support member that supports the optical fiber, where a surface of the support member supports the optical fiber, opposes and is mounted to the mounting substrate, optically coupling the optical element and the optical fiber, wherein
   the support member has a fiber anchoring groove of a given length and fixing an end of the optical fiber,
   the fiber anchoring groove has a first groove of a depth for preventing contact of the optical fiber with the mounting substrate and a second groove for anchoring the optical fiber; and
   a coupling position where an output end of the optical element and an input end of the optical fiber are optically coupled by mounting of the support member to the mounting substrate is provided at an internal position of a given distance from an end of the mounting substrate,
   wherein the first groove has a width that is greater than or equal to a diameter of cladding of the optical fiber and the second groove has a depth on an order of half of the diameter of the cladding of the optical fiber, in the first grove.

2. The optical module according to claim 1, wherein the first groove is formed by:
   a groove that corresponds to a diameter of a coating of the optical fiber, and
   a groove that corresponds to a diameter of a functional region of the optical fiber.

3. The optical module according to claim 1, wherein the support member and the optical element are bonded to the mounting substrate by surface activated bonding.

4. The optical module according to claim 1, wherein alignment marks for aligning the support member and the mounting substrate are provided on the surface of the support member, supporting the optical fiber and the mounting substrate.

5. The optical module according to claim 1, wherein the optical element includes:
   a laser diode that outputs light of a given wavelength, and
   a wavelength converter element that wavelength converts the light of the given wavelength output from the laser diode.

6. The optical module according to claim 5, wherein an optical waveguide that guides light output from the wavelength converter element to an input end of the optical fiber is included as the optical element.

7. An optical module comprising:
   a mounting substrate,
   an optical element mounted on the mounting substrate,
   an optical fiber, and
   a support member that supports the optical fiber, where a surface of the support member supports the optical fiber, opposes and is mounted to the mounting substrate, optically coupling the optical element and the optical fiber, wherein
   the support member has a fiber anchoring groove of a given length and fixing an end of the optical fiber,
   the fiber anchoring groove has a first groove of a depth for preventing contact of the optical fiber with the mounting substrate and a second groove for anchoring the optical fiber; and
   a coupling position where an output end of the optical element and an input end of the optical fiber are optically coupled by mounting of the support member to the mounting substrate is provided at an internal position of a given distance from an end of the mounting substrate,
   wherein the first groove is formed by:
   a groove that corresponds to a diameter of a coating of the optical fiber, and
   a groove that corresponds to a diameter of a functional region of the optical fiber.

* * * * *